United States Patent [19]

Yamanouchi et al.

[11] Patent Number: 5,306,978

[45] Date of Patent: Apr. 26, 1994

[54] SURFACE ACOUSTIC WAVE UNIDIRECTIONAL TRANSDUCER HAVING FLOATING ELECTRODES

[75] Inventors: Kazuhiko Yamanouchi, 37-13, Matsugaoka, Taihaku-Ku, Sendai City, Miyagi Pref.; Mitsuhiro Tanaka, Chita, both of Japan

[73] Assignees: Kazuhiko Yamanouchi; NGK Insulators, Ltd., Japan

[21] Appl. No.: 64,675

[22] Filed: May 21, 1993

Related U.S. Application Data

[63] Continuation of Ser. No. 935,920, Aug. 27, 1992, abandoned.

[30] Foreign Application Priority Data

Aug. 29, 1991 [JP] Japan .................................. 3-218498

[51] Int. Cl.$^5$ ............................................. H01L 41/08
[52] U.S. Cl. .............................. 310/313 C; 310/313 B; 333/151; 333/154
[58] Field of Search ........... 310/313 R, 313 B, 313 C, 310/313 D; 333/151, 154, 194–196

[56] References Cited

U.S. PATENT DOCUMENTS

| | | | |
|---|---|---|---|
| 4,006,438 | 2/1977 | Bennett | 310/313 C X |
| 4,166,257 | 8/1979 | Subramanian | 310/313 C X |
| 4,689,586 | 8/1987 | Yamada et al. | 310/313 R X |

FOREIGN PATENT DOCUMENTS

| | | |
|---|---|---|
| 3618913 | 12/1986 | Fed. Rep. of Germany . |
| 56-16313 | 2/1981 | Japan . |
| 3-20929 | 3/1991 | Japan . |

OTHER PUBLICATIONS

IEEE Ultrasonics Symposium Proc.; Oct. 2–5, 1988 Chicago, US; (pp. 57–61); Takeuchi; "Field Analysis of Saw Single-Phase Unidirectional Transducers Using Internal Floating Electrodes".

Electronics Letters, vol. 20, No. 24, Nov. 22, 1984, Enage, GB; (pp. 989–990) Yamanouchi "New Low-Loss Saw Filter Using Internal Floating Electrode Reflection Types of Single-Phase Unidirectional Transducer".

Electronics and Communications in Japan, vol. 62, No. 2, Feb. 1979, New York, US; (pp. 10–17); Kouji Hohkawa et al. "Surface Acoustic Wave Filters Without Apodization Loss".

"High Performance with High Frequency Acoustic Surface Wave Devices", Yamanouchi, 1991, pp. 36–37.

Research Institute of Electrical Communication, Tohoku University, "GHz-Range Low-Loss Wide Band Filters Using New Floating Electrode Type Unidirectional Transducers", Yamanouchi et al., US 92-53 1992, pp. 17–21.

Research Institute of Electrical Communication, Tohoku University, "A Field Analysis of Saw Single-Phase Unidirectional Transducers Using Internal Floating Electrodes", Takeuchi et al., pp. 17–22.

Research Institute of Electrical Communication, Tohoku University, "Unidirectional Response of Inerdigital Transducers on LiNbO$_3$ Substrate" Suzuki et al., pp. 201–205.

(List continued on next page.)

*Primary Examiner*—Mark O. Budd
*Attorney, Agent, or Firm*—Parkhurst, Wendel & Rossi

[57] ABSTRACT

In a surface acoustic wave transducer including a substrate made of a piezoelectric material, an input side IDT structure having positive and negative electrodes arranged in an interdigit manner and floating electrodes arranged between successive positive and negative electrodes, and an output side IDT structure having positive and negative electrodes arranged in an interdigit manner and floating electrodes arranged between successive positive and negative electrodes, the electrodes of the input and output side IDT structures are arranged such that a surface acoustic wave propagates in one direction, distances between corresponding tracks in the input and output side IDT structures are linearly changed and lengths of these tracks are changed in accordance with a predetermined window function.

10 Claims, 9 Drawing Sheets

Research Institute of Electrical Communication, Tohoku University, "Research and Development of Surface Acoustic Wave Unidirectional Transducers", Yamanouchi, Oct. 1989, pp. 7–14.

Electronics Letters, "New Low-Loss Saw Filter Using Internal Floating Electrode Reflection Types of Single-Phase Unidirectional Transducer", Yamanouchi et al., Oct. 1984, pp. 989–990.

Electronics Letters, "Low-Loss Saw Filter Using Internal Reflection Types of Single-Phase Unidirectional Transducer", Yamanouchi et al., Aug. 1984, pp. 819–821.

Research Institute of Electrical Communication, Tohoku University, "Low-Loss Saw Filter Using Internal Reflection Types of New Single-Phase Unidirectional Transducer", Yamanouchi et al., 1984 Ultrasonics Symposium, pp. 68–71.

Research Institute of Electrical Communication, Tohoku University, "Acoustic Surface Ways Filters Using New Distance Weighting Techniques", Yamanouchi et al., 1980 Ultrasonics Symposium, pp. 313–316.

"Fundamental of Microwave Circuit and its Application", Aug. 1990, Y. Konishi, pp. 280–285.

"Technical Handbook of Acoustic Wave Elements", Nov. 1991, Y. Yamanouchi, pp. 192–195.

FIG_3

FIG_4

FIG_5
PRIOR ART

FIG_6

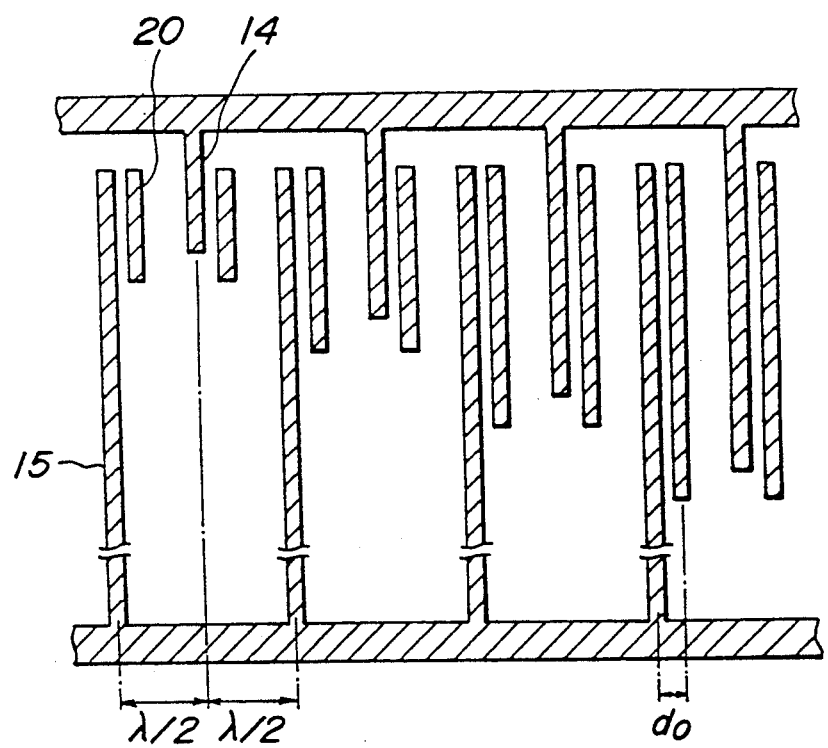
FIG_8

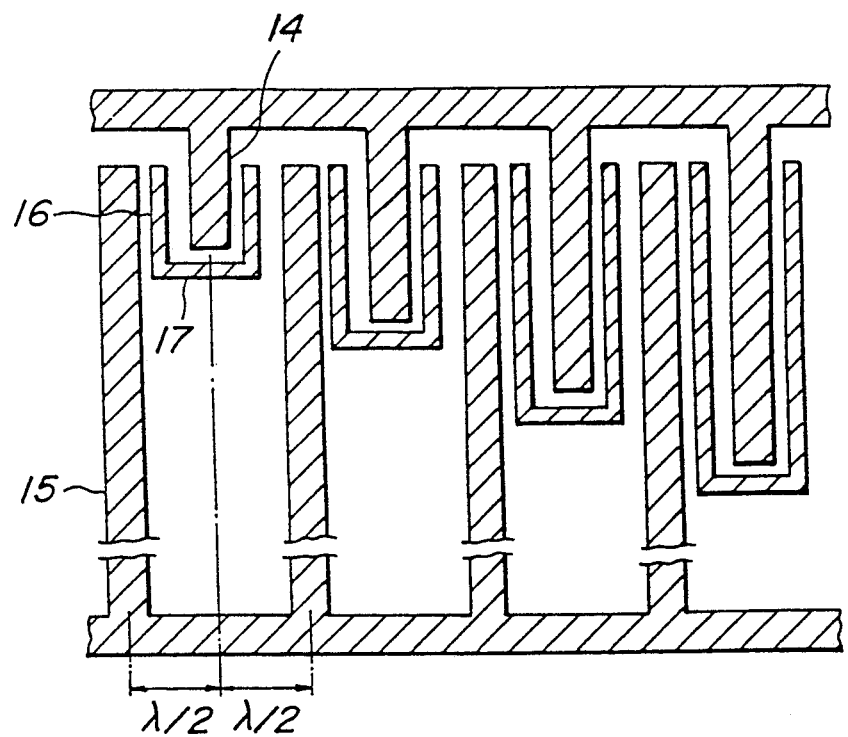
FIG_9

SURFACE ACOUSTIC WAVE UNIDIRECTIONAL TRANSDUCER HAVING FLOATING ELECTRODES

This is a continuation of Ser. No. 935,920 filed Aug. 27, 1992, now abandoned.

BACKGROUND OF THE INVENTION

1. Field of the Invention

The present invention generally relates to a surface acoustic wave transducer, and more particularly to a surface acoustic wave unidirectional transducer having interdigital electrodes and floating electrode arranged between successive interdigital electrodes.

There has been known a surface acoustic wave transducer comprising a piezoelectric substrate and interdigital electrodes applied on a surface of the piezoelectric substrate. Such a transducer having the interdigital electrodes is called IDT and has been widely used as various kinds of filters for a mobile communication system.

2. Related Art Statement

There have been proposed various IDT electrode arrangements. For instance, Japanese Patent Publication Tokko Hei 3-20929, there is described a known IDT electrode arrangement, in which open-type or short-circuit-type floating electrodes are provided between successive positive and negative electrodes such that the floating electrodes are not brought into contact with the positive and negative electrodes. In such a known IDT electrode arrangement, a direction of a surface acoustic wave reflected by the open-type or short-circuit-type floating electrodes becomes unidirectional.

There have been proposed various kinds of the unidirectional transducers such as a unidirectional transducer using a multistrip coupler, a multi-phase type unidirectional transducer and a single-phase type unidirectional transducer (refer to Japanese book, "Fundaments and Applications of Microwave Circuit", published on Aug. 20, 1990 from Sougou Densi Shuppan, page 280). The known IDT electrode arrangement disclosed in the above mentioned Japanese Patent Publication belongs to the single-phase type unidirectional transducer utilizing the reflection by both the open-type and short-circuit-type floating electrodes.

The reason why the unidirectional transducer using the floating electrodes has a large unidirectional property is as follows. A reflecting coefficient of a metal strip electrode applied on a piezoelectric substrate varies depending upon the thickness, width, etc. of the metal electrode and a phase of a surface acoustic wave reflected by a short-circuit-type floating electrode differs from a phase of the wave reflected by the open-type floating electrode by 180 degrees. When the open-type floating electrode is formed at a position which is deviated from a middle point between adjacent positive and negative exciting electrodes of IDT, there is produced a shift between, an exciting center of the surface acoustic wave and a reflection center, so that the directionality can be attained. When the short-circuit-type floating electrodes are used, the reflection phase is reversed, so that the reversed directionality can be obtained. Therefore, when two floating electrodes are provided, there are obtained large reflection and directionality.

The above explained surface acoustic wave transversal filter has various properties. That is to say, since the propagating velocity of the surface acoustic wave is lower than that of the electromagnetic wave, the device can be small in size and light in weight. Further, the signal tapping on the substrate can be performed easily and the shape of the IDT electrode arrangement corresponds directly to the impulse response.

There have been various known methods of weighting the electrodes corresponding to the impulse response. For instance, a length of portions of adjacent positive and negative electrodes and floating electrodes which are opposed to each other viewed in a direction of the electrode array, i.e., a wave propagating direction is changed such that the length is maximum at a middle of the electrode array and is gradually decreased toward ends of the electrode array so that the exciting intensity is suitably distributed along the direction in which the electrodes extend. Hereinafter, said length of portions of electrodes which are opposed to each other is sometimes called an opposing length of electrodes. This weighting method is usually termed as the apodize method. In an axial direction weighting method, the opposing length of electrode is made constant over the whole electrode array and an intensity of an exciting electric field is changed in the direction of the electrode array such that the electric field becomes maximum at a middle of the electrode array and is gradually decreased toward both ends of the electrode array. A similar function can be attained by deleting some electrodes from the electrode array. This later weighting method is called the electrode withdrawal weighting method.

FIG. 1 is a plan view showing a known surface acoustic wave transducer. This transducer 1 comprises a substrate made of a piezoelectric material, an input or transmission side IDT electrode structure 2 and an output or reception side IDT electrode structure 3, the input and output side IDT electrode structures 2 and 3 being formed on a surface of the substrate 1. Electrodes of the input side IDT electrode structure 2 are weighted in accordance with the apodize method and electrodes of the output side electrode structure 3 are of normal type.

In the known unidirectional surface acoustic wave transducers including the transducer shown in FIG. 1, a component having a desired frequency could not be derived efficiently and an insertion loss could not be reduced sufficiently.

SUMMARY OF THE INVENTION

The present invention has for its object to provide a novel and useful surface acoustic wave unidirectional transducer, in which a component having a desired frequency can be obtained efficiently, an insertion loss can be made very small, and the whole transducer can be small in size.

According to the invention, a surface acoustic wave transducer comprises:

a substrate made of a piezoelectric material and having a surface;

an input side interdigital electrode structure applied on the surface of substrate and including a plurality of input side positive electrodes, a plurality of input side negative electrodes each of which is arranged between successive input side positive electrodes and a plurality of input side floating electrodes which are arranged between successive input side negative and positive electrodes; and an output side interdigital electrodes structure applied on the surface of substrate and including a plurality of output side positive, electrodes, a plurality of output side negative electrodes each of which is arranged between successive output side positive electrodes and a plurality of output side floating electrodes which are arranged between successive output side negative and positive electrodes; wherein in each of the input and output side interdigital electrode structures, the positive electrodes, negative electrodes and floating electrodes are arranged such that a phase of a surface acoustic wave excited by the interdigital electrode structure and a phase of a surface acoustic wave reflected by the floating electrodes are substantially identical with each other viewed in a propagating direction of the wave and are different from each other substantially by 180 degrees viewed in a direction opposite to the propagating direction of the wave, in each of the input and output side interdigital structures, the positive and negative electrodes and floating electrodes are arranged such that there are formed a plurality of tracks which are arranged in parallel with each other, each of the tracks extending in the propagating direction of the wave, distances between corresponding tracks in the input and output side interdigital electrodes structures are varied viewed in a direction perpendicular to the propagating direction of the wave, and lengths of the tracks viewed in the direction perpendicular to the propagating direction of the wave are changed in accordance with a given function.

According to the invention, the distances between the tracks of the input and output side interdigital electrode structures are varied linearly. It should be noted a distance between corresponding tracks means a minimum distance between innermost electrodes of these tracks measured in the propagating direction of the surface acoustic wave. At the same time, the lengths of these tracks of the input and output side interdigital electrode structures are changed in accordance with a given function. A length of a track measured in the direction perpendicular to the wave propagating direction corresponds to an aperture length of the track. Therefore, it may be said that according to the invention the aperture lengths of successive tracks are changed in accordance with a given function. This function may be determined at will, and it is preferable to use a function selected from a window function group including Kaiser function, Hamming function and Hanning function. In the present specification, above mentioned arrangement of the electrodes is also called a distance-weighting.

In a preferable embodiment of the surface acoustic wave transducer according to the invention, the floating electrodes are formed solely by the open-type floating electrodes or the short-circuit-type floating electrodes. In another preferable embodiment, the floating electrodes are composed of open-type floating electrodes and short-circuit-type floating electrodes. Further, the floating electrodes may be arranged in an asymmetrical manner with respect to adjacent positive and negative electrodes in the input and output side interdigital electrode structures. That is to say, each of the floating electrodes is arranged at a point which is deviated from a middle point between adjacent positive and negative electrodes.

When both the open-type floating electrodes and short-circuit-type floating electrodes are used, the substrate is preferably made of a piezoelectric material having an electro-mechanical coupling constant $K^2$ equal to or higher than 1%. When only the short-circuit-type floating electrodes or open-type electrodes are provided, the substrate is preferably made of a piezoelectric material having the electro-mechanical coupling constant $K^2$ equal to or lower than 1%. Quartz may be advantageously used for the latter piezoelectric material.

In the surface acoustic wave transducer according to the invention, when a RF voltage is applied across the positive and negative electrodes of the input side interdigital electrode structure, there are produced periodic distortions in a surface domain of the substrate due to the piezoelectric effect. At a frequency $f_0$ (=v/d: wherein v is a propagating velocity of the surface acoustic wave and d is a pitch of the interdigital electrodes) at which a wavelength of the surface acoustic wave is substantially equal to the pitch d of the interdigital electrodes, surface acoustic waves produced between respective interdigital electrodes are added to each other in the same phase, so that the surface acoustic wave having a large energy is produced by the input side interdigital electrode structure and is fully received by the output side interdigital electrode structure, so that the transducer having high converting efficiency and sensitivity can be obtained.

In the surface acoustic wave transducer according to the invention, the input and output side interdigital electrode structures are arranged in accordance with the distance-weighting method as explained above, and therefore the increase in the insertion loss can be suppressed and the number of electrodes can be reduced as compared with the known transducer shown in FIG. 1 in which the input side IDT 2 is weighted by the apodize method and the output side IDT 3 is formed by a conventional type interdigital electrode arrangement. Further, according to the invention, the floating electrode arrangement is made asymmetrical with respect to positive and negative electrodes of respective pairs of the interdigital electrodes structure, and thus the reflection of the surface acoustic wave can be increased and a narrow band filter having a strong directionality and a small ripple can be realized.

BRIEF DESCRIPTION OF THE DRAWINGS

FIG. 8 is a plan view showing a portion of a fourth embodiment of the surface acoustic wave transducer according to the invention; and FIG. 9 is a plan view showing a portion of a fifth embodiment of the surface acoustic wave transducer according to the invention.

DESCRIPTION OF THE PREFERRED EMBODIMENTS

Before explaining embodiments of the surface acoustic wave transducer according to the invention, the basic conception of the present invention will be first explained.

In general IDT, positive and negative electrodes are provided on a surface of a piezoelectric substrate such that these electrodes are separated from each other by a distance $\lambda/2$, and when an AC voltage having a frequency $f=v/\lambda$ is applied across these electrodes, there is produced a surface acoustic wave having a wavelength substantially equal to $\lambda$. The thus excited surface acoustic wave is propagated equally in opposite directions along the electrode array within a surface region of the piezoelectric substrate. When the floating electrodes are arranged between positive and negative electrodes at positions which are deviated from middle points between positive and negative electrodes, the bidirectionality of the surface acoustic wave is disturbed and the surface acoustic wave which propagates in one direction along the electrode array becomes larger than that which propagates in the opposite direction.

Figure 2:
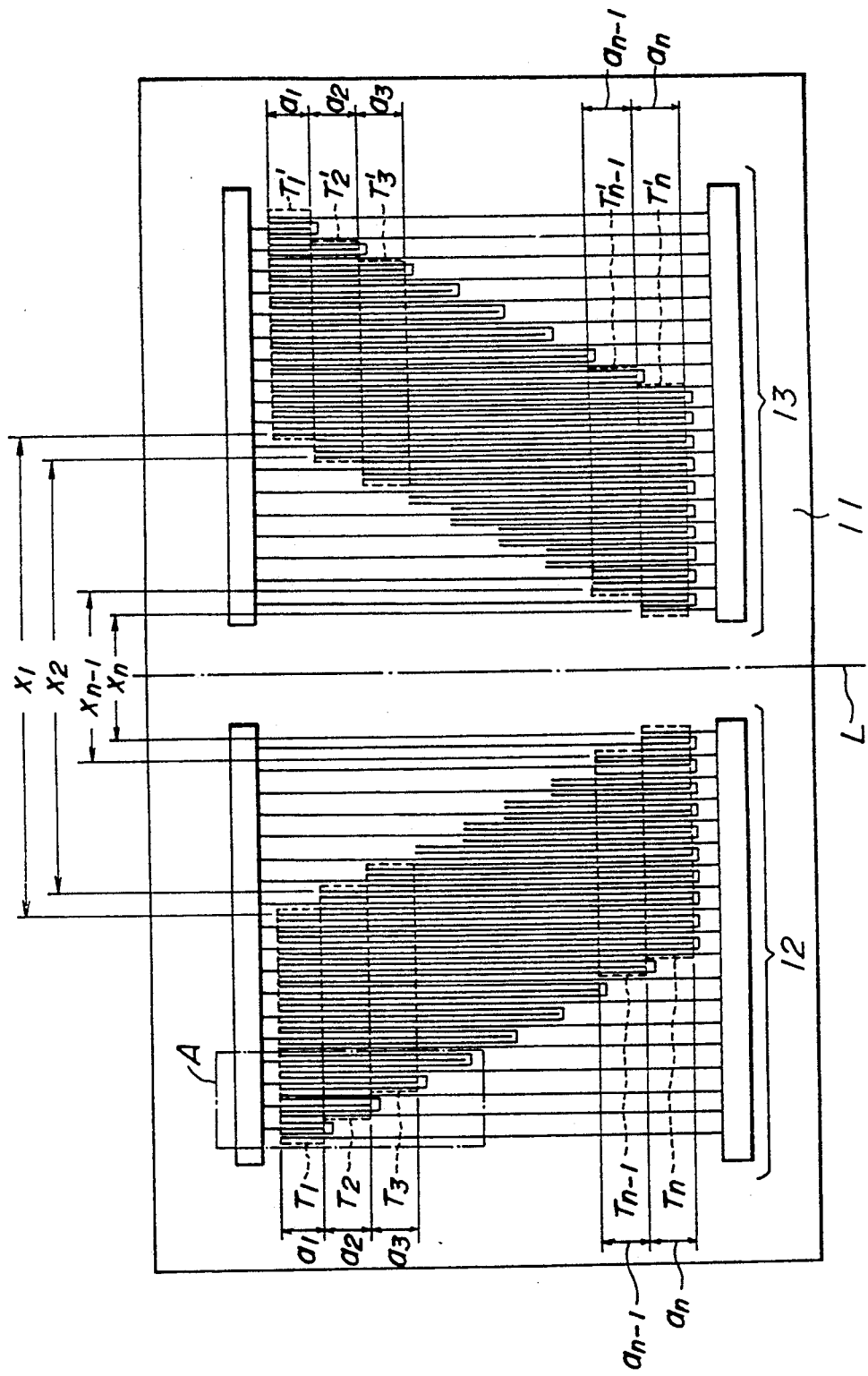
FIG. 2 is a plan view illustrating the whole construction of a first embodiment of the surface acoustic wave transducer according to the invention.

FIG. 2 is a plan view showing a first embodiment of the surface acoustic wave transducer according to the invention. The transducer comprises a substrate 11 made of a piezoelectric material, input side IDT structure 12 including positive and negative electrodes which are arranged in an interdigit manner, and an output side IDT structure 13 having positive and negative electrodes also arranged in an interdigit manner.

Figure 3:
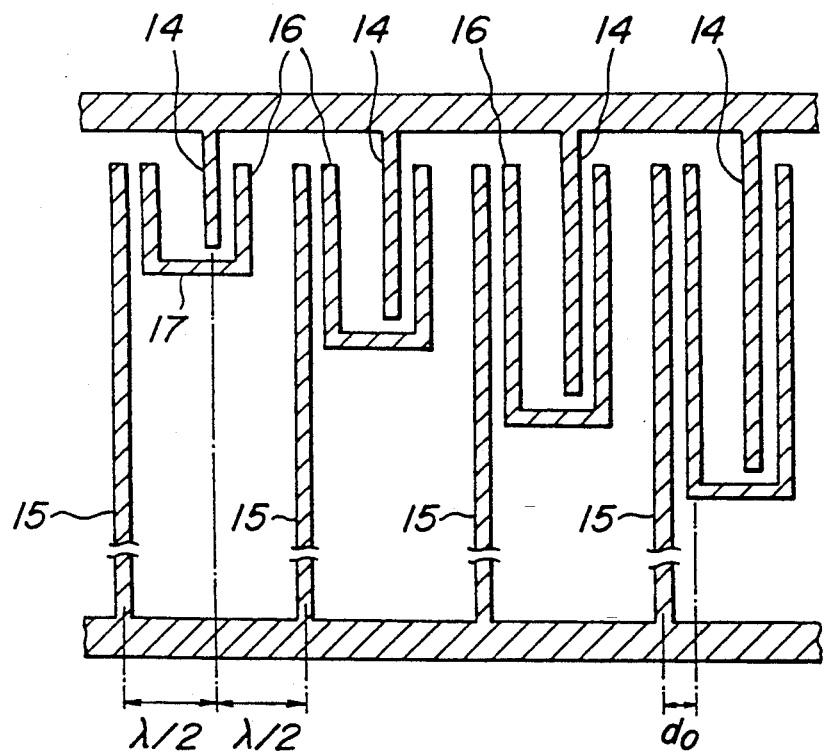
FIG. 3 is a plan view depicting a portion of the transducer shown in FIG. 2 on an enlarged scale.

FIG. 3 is a plan view illustrating a portion A of the input side IDT structure 12 shown in FIG. 2 on an enlarged scale. The IDT structure 12 comprises positive and negative electrodes 14 and 15 which are arranged in an interdigit manner. There are further provided floating electrodes 16 between adjacent positive and negative electrodes 14 and 15 of the IDT structure 12. In the present embodiment, adjacent floating electrodes 16 are connected to each other by means of a bridging member 17 so as to form the short-circuit-type floating electrodes.

As shown in FIG. 3, the short-circuit-type floating electrodes 16 are arranged such that they are closer to the negative electrodes 15. That is to say, the floating electrodes 16 are not arranged at middle points between positive and negative electrodes 14 and 15, but are provided at positions which are closer to the negative electrodes 15. A distance $d_0$ between a center of the negative electrode 15 and a center of the floating electrode 16 is suitably determined within a range of $\lambda/12 < d_0 < \lambda/6$. By arranging the floating electrodes 16 in the manner explained above, an impedance of the floating electrodes is suitably determined such that a surface acoustic wave having a large energy is propagated in one direction along the electrode array. That is to say, a phase of a wave reflected by the short-circuit-type floating electrodes is reversed to that of waves which are generated by the positive and negative electrodes, and thus the energy of the surface acoustic wave which propagates in one direction is selectively increased.

As shown in FIG. 2, the electrode arrangement of the input side IDT structure 12 and the electrode arrangement of the output side IDT structure 13 are symmetrical with respect to a center line L which is perpendicular to wave propagating paths and passes middle points of the wave propagating paths. Further, the positive electrodes 14, negative electrodes 15 and floating electrodes 16 of the input and output side IDT structures 12 and 13 are arranged in accordance with the distance-weighting method. This will be explained more in detail. An area of the substrate 11 on which the positive electrodes 14, negative electrodes 15 and floating electrodes 16 of the input side IDT structure 12 constitutes an active region, and this active region is divided into a plurality of tracks $T_1$, $T_2$, $T_3$ - - - $T_{n-1}$ and $T_n$. In each of the tracks, the floating electrodes 16 are arranged between adjacent positive and negative electrodes 14 and 15 and each of the tracks extends in the wave propagating direction. Similarly, in the output side IDT structure 13, there are formed a plurality of tracks $T_1'$, $T_2'$, $T_3'$ - - - $T_{n-1}'$ and $T_n'$. According to the invention, it is defined a distance $x_i$ between a track $T_i$ of the input side IDT structure 12 and a corresponding track $T_i'$ in the output side IDT structure 13. This distance is a distance between the innermost electrodes of these tracks as shown in FIG. 2. The successive distances between corresponding tracks are changed linearly. That is t say, a difference between successive track distances $x_i - x_{i-1}(2 \leq i \leq n)$ is set to be constant which is an integer multiple of $\lambda/2$. That is to say, $x_i - x_{i-1} = M\lambda/2$ should be satisfied, wherein M is an integer number. Further, there is defined a length of a track measured in a direction perpendicular to the wave propagating direction. That is to say, lengths of the tracks $T_1$, $T_2$, $T_3$ - - - $T_{n-1}$ and $T_n$ and $T_1'$, $T_2'$, $T_3'$ - - - $T_{n-1}'$ and $T_n'$ are represented by $a_1$, $a_2$, $a_3$ - - - $a_{n-1}$ and $a_n$. According to the invention, these lengths $a_1$, $a_2$, $a_3$ - - - $a_{n-1}$ and $a_n$ are determined in accordance with a desired function. This function may be a window function such as Hamming function, Hanning function and Kaiser function.

In the present embodiment, the distances $x_1$, $x_2$, $x_3$ - - - $x_{n-1}$ and $x_n$ between corresponding tracks $T_1$, $T_2$, $T_3$ - - - $T_{n-1}$ and $T_n$ and $T_1'$, $T_2'$, $T_3'$ - - - $T_{n-1}'$ and $T_n'$ of the input and output side IDT structures 12 and 13 are linearly decreased by a constant length of $\lambda(M=2)$, and the lengths $a_1$, $a_2$, $a_3$ - - - $a_{n-1}$ and $a_n$ of these tracks are changed in accordance with the Kaiser function. Therefore, the lengths are set maximum at the middle track and are gradually decreased toward the ends of the track array.

The substrate 11 may be made of a piezoelectric material such as $LiNbO_3$, $LiTaO_3$, quartz, $Bi_{12}GeO_{20}$, $AlPO_4$ and $Li_2B_4O_7$. In the present embodiment, the floating electrodes 16 are solely formed by short-circuit-type electrodes, so that it is preferable to use the quartz having the electro-mechanical coupling constant $K^2$ smaller than 1%.

The electrodes of the unidirectional transducer using the reflection by the floating electrodes may be manufactured by a photolithography which has been well developed in the method of manufacturing semiconductor integrated circuits. A width of the electrodes is in a range of $\lambda/16$ to $\lambda$, so that a frequency lower than 300 MHz is preferable. In the present embodiment, there is obtained a surface acoustic wave filter having a frequency of 100 MHz and the insertion loss of about 2.3 dB.

In the first embodiment of the surface acoustic wave unidirectional filter according to the present invention, the number of the electrode pairs may be reduced and the energy or power of the surface acoustic wave having the unidirectional property can be increased very much. This results in that the size of the filter can be decreased. Particularly, when the electromechanical coupling constant $K^2$ is small, the mechanical reflection due to the addition of the electrode mass is important for obtaining the unidirectional property. To this end, it is desired to provide only the short-circuit-type floating electrodes for making the mechanical reflection asymmetric as in the case of the first embodiment shown in FIG. 2.

Figure 1:
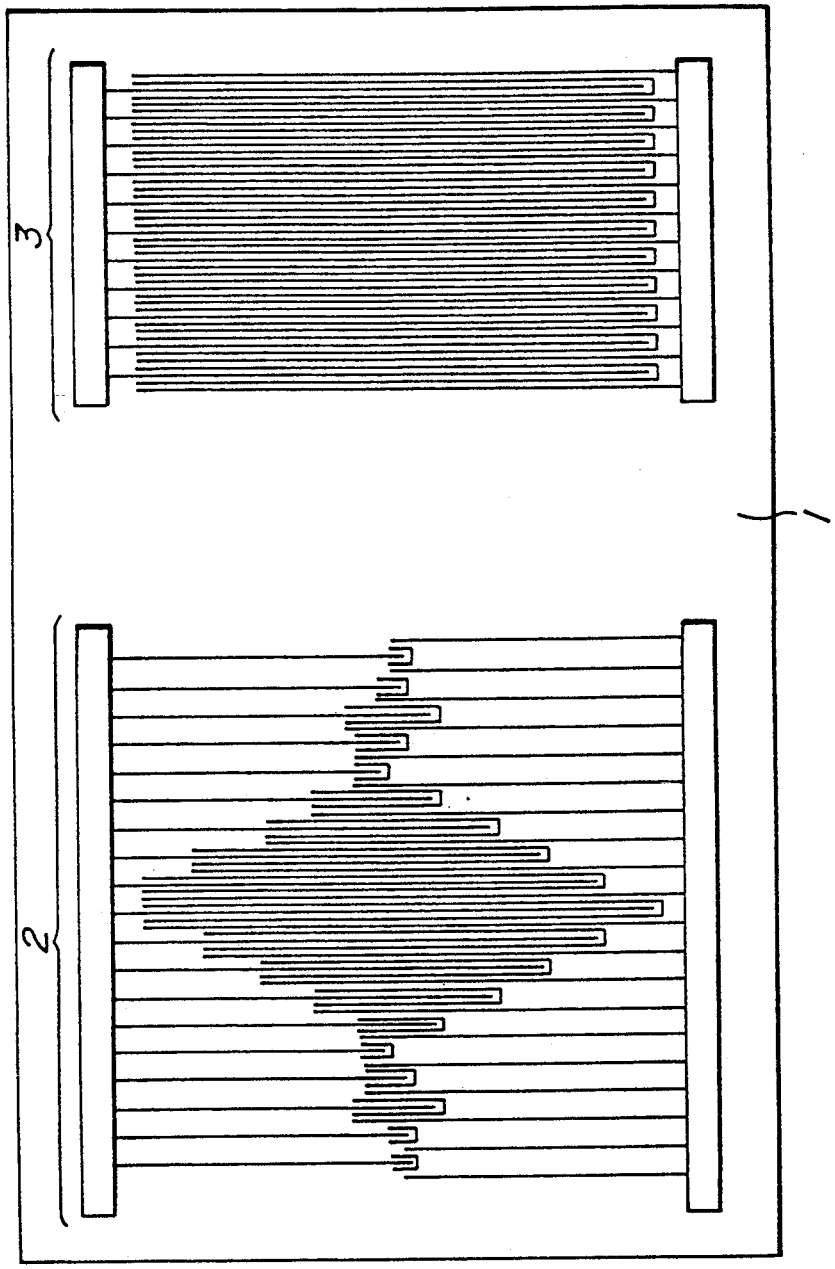
FIG. 1 is a plan view showing a known surface acoustic wave transducer.
Figure 4:
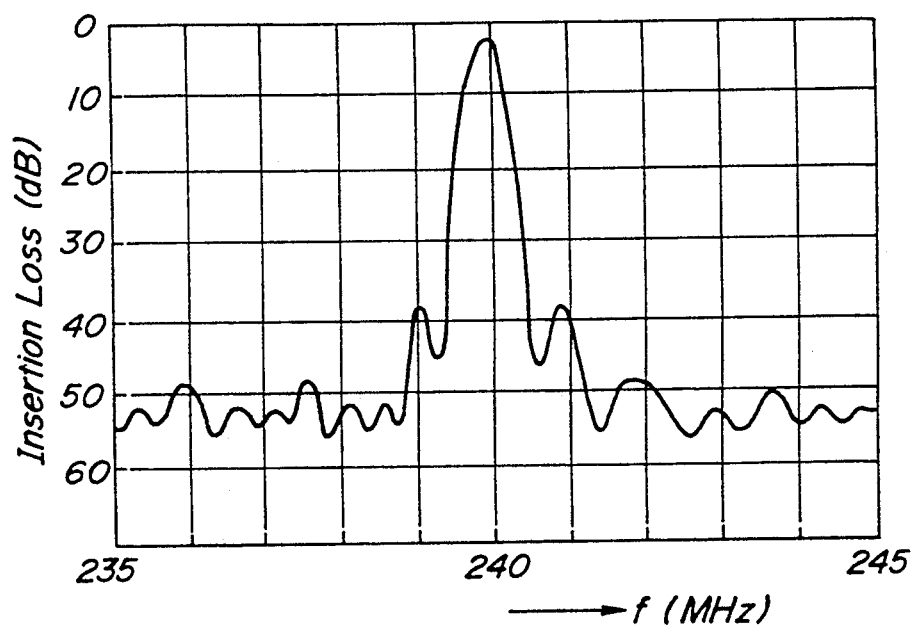
FIG. 4 is a graph showing a frequency characteristic of the first embodiment of the surface acoustic wave transducer shown in FIG. 2.
Figure 5:
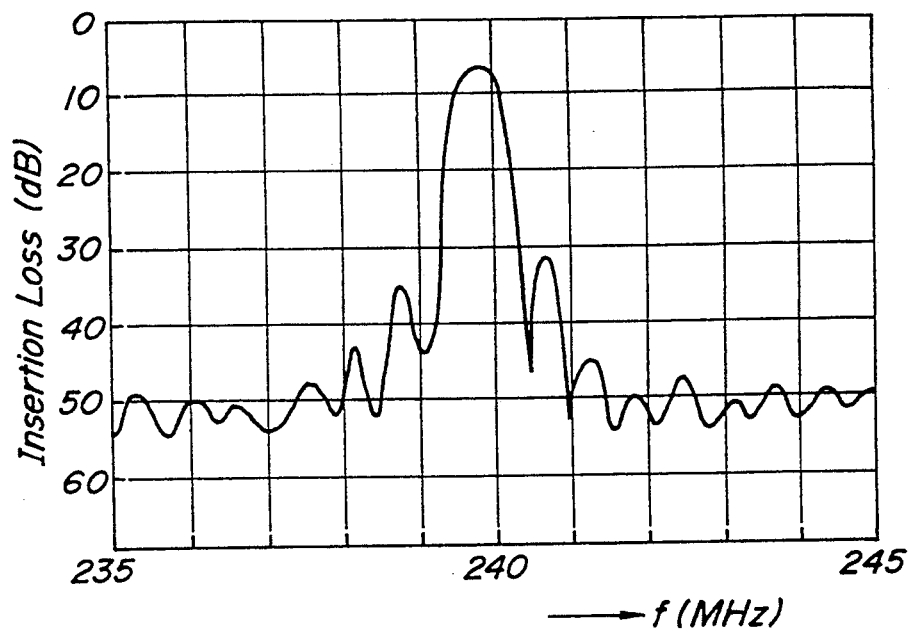
FIG. 5 is a graph illustrating a frequency characteristic of the known transducer depicted in FIG. 1.

FIG. 4 is a graph showing the frequency characteristic of the first embodiment of the surface acoustic wave transducer according to the invention illustrated in FIGS. 2 and 3 and FIG. 5 is a graph representing the frequency characteristic of the known surface acoustic wave filter shown in FIG. 1. Upon comparing these graphs with each other, it can be understood that the insertion loss of the surface acoustic wave filter according to the invention is smaller than the known surface acoustic wave filter and a suppression in frequency regions outside the desired frequency range of the surface acoustic wave filter according to the invention is larger than that of the known surface acoustic wave filter.

In this manner, according to the invention, the number of the electrode pairs can be reduced to a great extent, and thus the size of the transducer can be made smaller than the known transducer. Further the power outside the desired frequency range can be suppressed largely and the surface acoustic wave filter having a small insertion loss can be realized.

Figure 6:
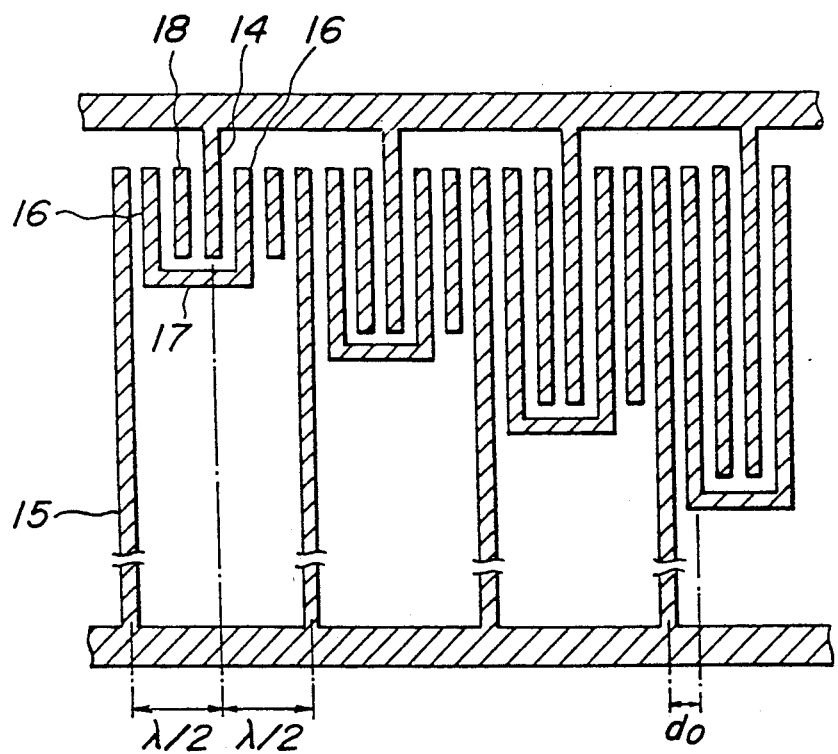
FIG. 6 is a plan view showing a portion of a second embodiment of the surface acoustic wave transducer according to the invention.

FIG. 6 is a plan view showing a portion of a second embodiment of the surface acoustic wave transducer according to the invention. In the present embodiment, open-type floating electrodes 18 are arranged between the short-circuit type floating electrodes 16 and the positive and negative electrodes 14 and 15 of the input and output side IDT structures 12 and 13. In the second embodiment, it is preferable to use the substrate 11 made of a piezoelectric material having the electromechanical coupling constant $K^2$ not lower than 1%.

Figure 7:
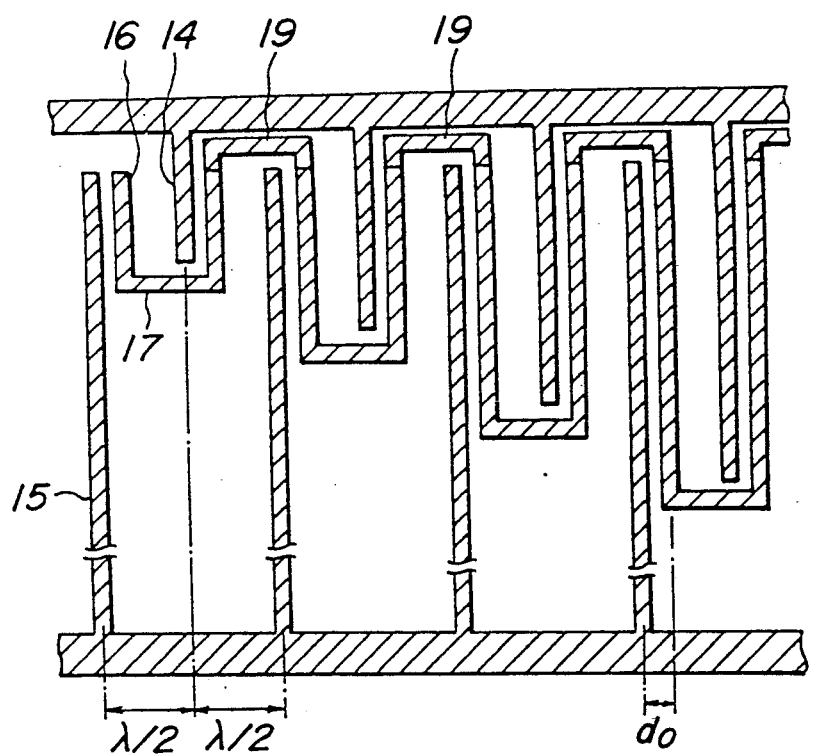
FIG. 7 is a plan view showing a portion of a third embodiment of the surface acoustic wave transducer according to the invention.

FIG. 7 is a plan view depicting a portion of a third embodiment of the surface acoustic wave transducer according to the invention. In the present embodiment, the short-circuit-type floating electrodes 16 are connected in series with each other by means of bridging members 19 to form an integral floating electrode construction.

FIG. 8 is a plan view illustrating a portion of fourth embodiment of the surface acoustic wave transducer according to the invention. In this embodiment, there are provided a plurality of open type floating electrodes 20 between successive positive and negative electrodes 14 and 15.

FIG. 9 is a plan view showing a portion of a fifth embodiment of the surface acoustic wave transducer according to the invention, in which a width of the positive and negative electrodes 14 and 15 of the IDT electrode structures is larger than a width of the floating electrodes 16 by about two times.

The present invention is not limited to the above mentioned embodiments, but many alterations and modifications may be conceived by those skilled in the art within the scope of the invention. In the above embodiments, the input side IDT structure 12 and the output side IDT structure 13 are formed symmetrically with respect to the center line L, but according to the invention these IDT structures may be formed asymmetrically. For instance, the output side IDT structure 13 may be formed by the conventional IDT structure.

Further, in the above embodiment, the number of the tracks of the input side IDT structure 12 is equal to that of the output side IDT structure 13, but these numbers may be different from each other. For instance, the number of the tracks in the output side IDT structure may be twice of the number of the tracks in the input side IDT structure. Moreover, in the above embodiments, the positive and negative electrodes in the input and output side IDT structures are arranged at the same pitch of $\lambda/2$, but according to the invention the pitch at which the positive and negative electrodes of the input side IDT structure are arranged may be different from the pitch at which the positive and negative electrodes of the output side IDT structure are arranged. For instance, the positive and negative electrodes of the input side IDT structure may be arranged at a pitch of $\lambda/2$ and the positive and negative electrodes of the output side IDT structure may be arranged at a pitch of $\lambda$.

In the above explanation, the negative and positive electrodes 14 and 15 may be interchanged mutually. That is to say, the positive electrodes 14 may be called the negative electrodes and the negative electrodes 15 may be called the positive electrodes.

As explained above in detail, in the unidirectional surface acoustic wave transducer according to the invention, the unidirectional property can be realized without providing a particular phase shifter, and the transducer can be small in size, because the number of electrode pairs can be reduced. Moreover, the insertion loss of the transducer according to the invention can be decreased. Further, the transducer according to the invention can be manufactured at a low cost.

What is claimed is:

1. A surface acoustic wave transducer comprising:
   a substrate comprised of a piezoelectric material and having a surface;
   an input side interdigital electrode structure applied on said surface of substrate and including a plurality of input side positive electrodes, a plurality of input side negative electrodes each of which is arranged between successive input side positive electrodes and a plurality of input side floating electrodes which are arranged between successive input side negative and positive electrodes; and
   an output side interdigital electrode structure applied on said surface of substrate and including a plurality of output side positive electrodes, a plurality of output side negative electrodes each of which is arranged between successive output side positive electrodes and a plurality of output side floating electrodes which are arranged between successive output side negative and positive electrodes; wherein in each of said input and output side interdigital electrode structures, said positive electrodes, negative electrodes and floating electrodes are arranged such that a phase of a surface acoustic wave excited by said interdigital electrode structure and a phase of a surface acoustic wave reflected by said floating electrodes are substantially identical with each other viewed in a propagating direction of the wave and are different from each other substantially by 180 degrees viewed in a direction opposite to said propagating direction of the wave, in each of said input and output side interdigital structures, said positive and negative electrodes and floating electrodes are arranged such that the there are formed a plurality of tracks which are arranged in parallel with each other, each of said tracks extending in the propagating direction of the wave, distances between corresponding tracks in the input and output side interdigital electrodes structures are varied viewed in a direction perpendicular to the propagating direction of the wave, and lengths of said tracks viewed in the direction perpendicular to the propagating direction of the wave are changed in accordance with a given function.

2. A surface acoustic wave transducer according to claim 1, wherein said distances between corresponding tracks in the input and output side interdigital electrode structures are linearly varied.

3. A surface acoustic wave transducer according to claim 2, wherein a difference in successive distances between corresponding successive tracks in the input and output side interdigital electrode structures is set to an integer multiple of a half wavelength of the surface acoustic wave.

4. A surface acoustic wave transducer according to claim 1, wherein said lengths of said tracks in the input and output side interdigital electrode structures are changed in accordance with a window function.

5. A surface acoustic wave transducer according to claim 4, wherein said lengths of said tracks in the input and output side interdigital electrode structures are changed in accordance with a Kaiser function.

6. A surface acoustic wave transducer according to claim 1, wherein said piezoelectric material of said substrate has an electro-mechanical coupling constant lower than 1% and said floating electrodes are formed by short-circuit-type or open-type floating electrodes.

7. A surface acoustic wave transducer according to claim 1, wherein said piezoelectric material of said substrate has an electro-mechanical coupling constant higher than 1% and said floating electrodes are formed by a combination of short-circuit-type floating electrode and open-type floating electrode.

8. A surface acoustic wave transducer according to claim 1, wherein each of said floating electrodes is arranged at a position between adjacent positive and negative electrodes which is derivative from a middle point between the positive and negative electrodes.

9. A surface acoustic wave transducer according to claim 8, wherein a width of said floating electrodes is set to $\lambda/12$ and a distance between a floating electrode and a positive or negative electrode which is closest to the relevant floating electrode is set to $\lambda/12$ to $\lambda/6$.

10. A surface acoustic wave transducer according to claim 1, wherein said input side interdigital electrode structure and output side interdigital electrode structure are arranged symmetrically with respect to a center line which is perpendicular to the propagating direction of the wave and passes through a middle point between the input side interdigital electrode structure and the output side interdigital electrode structure.

* * * * *